United States Patent [19] [11] 4,077,112
Theunissen et al. [45] Mar. 7, 1978

[54] METHOD OF MANUFACTURING CHARGE TRANSFER DEVICE

[75] Inventors: Matthias Johannes Joseph Theunissen; Roelof Pieter Kramer; Hermanus Leonardus Peek, all of Eindhoven, Netherlands

[73] Assignee: U.S. Philips Corporation, New York, N.Y.

[21] Appl. No.: 749,336

[22] Filed: Dec. 10, 1976

Related U.S. Application Data

[62] Division of Ser. No. 611,647, Sep. 9, 1975, abandoned.

[30] Foreign Application Priority Data

Sep. 24, 1974 Netherlands .......................... 7412567

[51] Int. Cl.$^2$ ............................................ B01J 17/00
[52] U.S. Cl. ...................................... 29/580; 29/589; 29/590; 357/24
[58] Field of Search .......................... 29/580, 589, 590; 357/24

[56] References Cited

U.S. PATENT DOCUMENTS

| 3,770,998 | 11/1973 | Engeler | 357/24 |
| 3,909,925 | 10/1975 | Forber | 357/24 |
| 4,012,759 | 3/1977 | Esser | 357/24 |
| 4,027,382 | 6/1977 | Tasch | 29/589 |

Primary Examiner—Roy Lake
Assistant Examiner—Mark S. Bicks
Attorney, Agent, or Firm—Frank R. Trifari; Jack Oisher; Steven R. Biren

[57] ABSTRACT

The invention relates to a charge transfer device (C.T.D.) with polycrystalline silicon electrodes which are provided on a nitride layer. The nitride layer has apertures between the polyelectrodes. Electrodes of a second metallization layer, for example, of aluminium, are provided via said apertures. The charge storage capacities per surface unit (and with equal voltages) can be made equal by subjecting the device for a short period of time to an oxidation treatment prior to providing the Al electrodes so that the oxide layer in the apertures can become thicker than below the Si electrodes.

7 Claims, 9 Drawing Figures

METHOD OF MANUFACTURING CHARGE TRANSFER DEVICE

This is a division of application Ser. No. 611,647, filed Sept. 9, 1975, now abandoned.

The invention relates to a charge transfer device comprising a semiconductor body having a surface-adjoining semiconductor layer in which means are present to locally introduce into the semiconductor layer information in the form of mobile charge carriers and means to read out said information elsewhere in the layer, and an electrode system for capacitively generating electric fields in the semiconductor layer is present on the surface by means of which fields the charge can be transported to the read-out means through the semiconductor layer in a direction parallel to the semiconductor layer. The electrode system comprises a series of electrodes which are insulated from the surface of the body by an insulating layer and which are associated alternately with a first conductor layer, hereinafter termed lowermost conductor layer, and with a second conductor layer, hereinafter termed uppermost conductor layer, each electrode of the uppermost conductor layer extending to above an adjacent electrode of the lowermost conductor layer and being separated therefrom by an intermediate insulating oxide layer which has been obtained by partly oxidizing the electrodes associated with the lowermost conductor layer.

Charge transfer devices form a generally known class of semiconductor devices which provide important and wide application possibilities, for example in the field of delay lines, filters and picture sensors. Known constructions of charge transfer devices are inter alia the bucket brigade device or B.B.D. and the charge coupled device, also referred to as C.C.D. In these devices the introduced information in the form of charge packets is each time transported from a storage site below an electrode to a subsequent storage site below an adjacent electrode, more or less in a step-wise manner, by applying suitable clock voltages to the electrodes.

In most of the practical embodiments the semiconductor body consists of silicon. In those cases in which the device forms a charge-coupled device with charge transport along the surface, the semiconductor layer in which the charge transport takes place may occupy the whole semiconductor body. In charge-coupled devices with bulk transport, however, the semiconductor layer will usually occupy only a thin, relatively high-ohmic sub-layer of the body of a conductivity type which, via a $p$-$n$ junction on the side present opposite to the surface, changes into a second sub-layer of the body of the second conductivity type.

In practical embodiments, the electrodes of the lowermost conductor layer which are provided first during manufacturing the device are usually formed by silicon layers in a polycrystalline form which are deposited on the insulating layer. By oxidation of the silicon, the electrodes of the lowermost conductor layer may be surrounded by a silicon oxide layer of the desired thickness which insulates the silicon electrodes electrically from the electrodes of the uppermost conductor layer to be provided in a subsequent process step. These electrodes may be, for example, of aluminum.

The use of electrode systems in the form of multilayer conductors in charge transfer devices presents many advantages over, for example, the use of a monolayer conductor, both technologically and as regards the electric functioning of the devices, and is therefore generally known. For example, the interelectrode space can be made very small, which is an important advantage in charge-coupled devices because said interelectrode spaces are often responsible for the formation of potential wells or potential hills between successive charge storage sites and can hence adversely influence the transport efficiency and/or the transport rate of the device.

The oxide layer which separates the electrodes of the lowermost and uppermost conductor layer from each other cannot be made arbitrarily thin, as will be obvious, but will have to be at least so thick that breakdown between the electrodes is prevented at the clock voltages to be applied to the electrodes. The oxidation treatment which is carried out to obtain said oxide layer can hence also often influence the silicon oxide layer on the surface of the body which insulates the electrodes from the body. In particular, for example, the semiconductor body may further oxidize, notably between the silicon electrodes, so that the silicon oxide layer between the silicon electrodes can become thicker than below said electrodes.

It has already been suggested, in order to avoid said drawback, to provide on the surface of the semiconductor body an oxide layer and thereon a silicon nitride layer. A dielectric in the form of such a double layer has the advantage that it does not change or at least hardly changes during the oxidation of the silicon electrodes provided (on the nitride layer), in particular as a result of the action of the nitride layer masking the semiconductor body against oxidation.

However, a number of drawbacks are associated with the use as an insulating layer of such a dielectric consisting of a double layer. For example, it may be necessary in behalf of the etching of contact holes in the nitride layer at the area of the input and/or the output of the device, to provide on the nitride layer an extra auxiliary masking layer, for example, of silicon oxide. Said auxiliary masking layer should be removed again in a further etching treatment.

Furthermore, as is known, it is often desired to subject the device to a so-called anneal treatment in a suitable medium during or at the end of the manufacturing process, so as to reduce the number of surface states at the interface between the semiconductor body and the insulating layer on the surface of the semiconductor body. It has been found that such a treatment in the presence of a nitride layer is often less effective than is desired, in particular when the device occupies a surface area which is comparatively large for a semiconductor device. A presumable cause hereof resides in the comparatively very high density of the silicon nitride material as a result of which it is substantially impenetrable even for, for example, hydrogen molecules, so that only lateral diffusion of gas molecules through the oxide layer of the crystal is possible.

One of the objects of the present invention is therefore to provide a charge transfer device in which the oxidation treatment to oxidize the electrodes of the lowermost conductor layer does not or at least does substantially not vary the insulating layer between the electrodes and the surface of the semiconductor body, and in which the said difficulties can be avoided at least for the greater part.

The invention is based inter alia on the recognition of the fact that by locally removing the silicon nitride layer, after the said oxidation treatment, the operation of the device to be manufactured need not or at least need hardly be influenced, while a structure is obtained which is very simple to manufacture technologically.

Therefore, a charge transfer device is characterized according to the invention in that the insulating layer which insulates the electrode from the surface of the semiconductor body comprises two sub-layers of different materials, namely a first sub-layer which adjoins the surface of the body and which extends both below the electrodes of the lowermost conductor layer and below the electrodes of the uppermost conductor layer, and a second sub-layer which is provided on the first sub-layer and which shows apertures present below the electrodes associated with the uppermost conductor layer and which is of a material which masks the underlying semiconductor material against oxidation and which can be etched selectively relative to the material of the first sub-layer.

During the manufacture of a device according to the invention, after the oxidation of the electrodes of the lowermost conductor layer, the second sub-layer (the nitride layer) may be subjected to an etching treatment without an extra photo-masking step. The electrodes of the lowermost conductor layer and the oxide layer grown on said electrodes mask the underlying nitride against said etching treatment so that the nitride layer will be removed only between said electrodes. Moreover, the nitride layer may at the same time be removed at the area of the input and/or the output of the device to be manufactured, so that it is not necessary in a later production stage to provide contact holes in the nitride layer, which considerably simplifies the manufacture of the device.

Further advantages of the device will become apparent from the following description of the Figures.

The invention relates in addition to a method of manufacturing a charge transfer device described above. According to the invention, such a method is characterized in that the insulating layer which insulates the electrodes from the surface of the semiconductor body is provided in the form of a double layer comprising a first sub-layer adjoining the surface of the body and a second sub-layer provided thereon and consisting of a material differing from the first sub-layer and masking the semiconductor body against oxidation, and that, after providing the electrodes belonging to the lowermost conductor layer, said electrodes are subjected to an oxidation treatment to obtain the said intermediate insulating layer, the second sub-layer masking the underlying material of the semiconductor body against oxidation during said oxidation treatment, and that after the oxidation treatment the second sub-layer is subjected to an etching treatment as a result of which the second sub-layer is removed locally, the electrodes of the lowermost conductor layer with the oxide layer formed thereon serving as an etching mask, and that after said etching treatment the electrodes of the uppermost conductor layer are provided which are separated from the surface of the semiconductor body at least mainly only by the first sub-layer of the insulating layer. By using such a method the drawbacks already described above can be avoided at least for the greater part.

An important preferred embodiment of a method according to the invention is characterized in that after the oxidation treatment of the electrodes of the lowermost conductor layer to obtain the said intermediate insulating layer, the semiconductor body is subjected to a gettering treatment in behalf of which the semiconductor body is covered, at least at its major surfaces, with an impurity-doped gettering oxide layer which is separated from the said surface by a screening layer which is of the same material as the said second sub-layer and which is provided prior to the said etching treatment above the electrodes of the lowermost conductor layer and the second sub-layer and which is removed again entirely during the etching treatment in which the second sub-layer of the insulating layer is locally removed.

The invention will now be described in greater detail with reference to the accompanying diagrammatic drawing, in which FIG. 1 is a sectional view of a part of a charge transfer device according to the invention;

It is to be noted that the Figures are diagrammatic only and are not drawn to scale for reasons of clarity.

Figure 1:
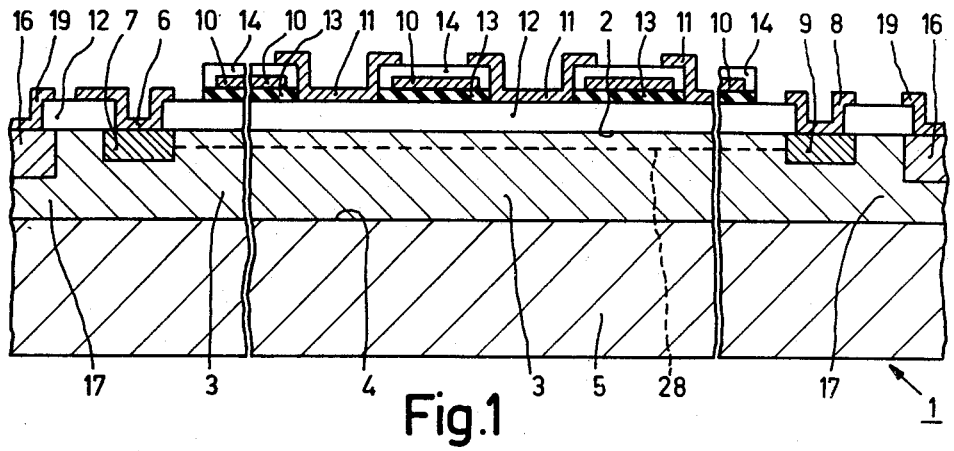

FIG. 1 is a cross-sectional view parallel to the charge transport direction of a part of a charge transfer device according to the invention.

The device comprises a semiconductor body of silicon having an $n$-type semiconductor layer 3 which adjoins the surface 2 and which, in case the charge transport takes place along the surface 2, may extend throughout the body 1, but which in the present case in which the charge is transported through the bulk of the body is formed only by a surface layer of the body which, via a $p$-$n$ junction 4, changes into a $p$-type part or substrate 5.

The semiconductor layer 3 comprises an electric input having the contact 6 and the contact 7 which is of the same conductivity type as and has a higher doping than the layer 3. It will be obvious that, besides via the electric input contact 6, 7, the information can also be introduced into the semiconductor layer differently, for example, by absorption of electromagnetic radiation. The semiconductor layer 3 furthermore has means to read out said information elsewhere in the layer 3, which means are denoted diagrammatically by the output contact 8 which is contacted to the layer 3 via the highly doped $n$-type contact zone 9.

Present on the surface 2 is an electrode system for capacitively generating electric fields in the layer 3 by means of which the charge can be transported through the semiconductor layer 3 in a direction parallel to the layer from the input 6, 7 to the output 8, 9. The device may be operated as a two-phase (four-phase) or as a three-phase charge transfer device. Dependent hereon, the electrodes 10, 11 belonging to the electrode system may be connected together with two or three clock lines not further shown in FIG. 1 to apply clock voltages. The electrode system comprises a series of electrodes 10, 11 which are insulated from the surface 2 of the body 1 by an insulating layer 12, 13. The electrodes 10, 11 being alternately to a first conductor layer, hereinafter termed lowermost conductor layer, and to a second conductor or, hereinafter termed uppermost conductor layer, the electrodes of the lowermost conductor layer being referenced 10 and the electrodes of the uppermost conductor layer being referenced 11. The electrodes 11 of the uppermost conductor layer each extend to above the adjacent electrodes 10 of the lowermost conductor layer, as is shown in FIG. 1, and are separated therefrom by an intermediate oxide layer 14 obtained by oxidizing the electrodes 10 partly. By using such an electrode system, the influence of the finite distances between the electrodes mutually on, for example, the transport efficiency of the device can be considerably reduced.

According to the invention, the insulating layer 12, 13 which insulates the electrodes 10, 11 from the surface 2 of the body 1 comprises two sub-layers of different materials which are referenced 12 and 13, respectively. The first sub-layer 12 adjoins the surface 2 of the body 1 and extends both below the electrodes 10 of the lowermost conductor layer and below the electrodes 11 of the uppermost conductor layer. Said sub-layer is formed by a silicon oxide layer which in the present embodiment has been obtained by conversion of semiconductor material of the semiconductor body 1 by oxidation. A second sub-layer 13 which, unlike the sub-layer 12, does not extend below all the electrodes is present on the oxide layer 12 and has apertures 15 (see also FIGS. 5 and 6) below the electrodes 11 of the uppermost conductor layer. The sub-layer 13 is of a material which masks the underlying semiconductor material of the body against oxidation and which can selectively be etched with respect to the silicon oxide of the first sub-layer. Although, of course, other materials may also be considered for this purpose, silicon nitride is a material which can advantageously be used for the second sub-layer 13.

According to the invention, one of the important advantages of a device as is shown in FIG. 1 is that, as will become apparent hereinafter, the manufacture thereof is simple in spite of the presence of the silicon nitride layer.

As is furthermore shown in FIG. 1, the electrodes 11 of the uppermost conductor layer are directly provided on the first sub-layer 12 of the insulating layer 12, 13 through the apertures in the second sub-layer 13.

The electrodes 10 of the lowermost conductor layer which consist of an oxidizable material are formed by layers of silicon which to be deposited in a polycrystalline form on the second sub-layer 13 of silicon nitride. The electrodes 11 of the uppermost conductor layer are of aluminum but may, of course, also consist of other suitable materials, for example, silicon.

As already noted, the device shown in FIG. 1 belongs to the type of charge-coupled device in which the charge transport takes place at least mainly via the interior of the semiconductor body. For that purpose, means are present to insulate the semiconductor layer 3 - at least during operation - from its surroundings. These means include inter alia the p-n junction 4 on the lower side of the layer 3 which, during operation, can be biased in the reverse direction, and the p-type isolation zone 16 which, viewed on the surface 2, surrounds the layer 3 entirely. The isolation zone 16 which may extend throughout the thickness of the layer 3 in this case extends only over a part of said thickness. By applying a sufficiently low voltage to the isolation zone 16, the island insulation may be completed by means of an electric field which extends below the isolation zone 16 in the body 1.

The thickness and the doping concentration in the semiconductor layer 3 are chosen to be so small that a depletion zone can be obtained throughout the thickness of the semiconductor layer by means of an electric field while avoiding breakdown. Potential minima may then be formed in the depleted semiconductor layer 3 so that majority charge carriers can be stored and transported at a finite distance from the surface 2. Such a thin high-ohmic layer may be formed, as in the embodiment described, by an epitaxial layer which is grown on the substrate 5, but may also be obtained, for example, by redoping a comparatively thin surface part of the substrate 5 by means of, for example, ion implantation.

The manufacture of the device shown in FIG. 1 will now be described in greater detail also with reference to FIGS. 2 to 6. Starting material is the p-type silicon substrate 5 which has a resistivity which preferably exceeds 10 ohm.cm and has a thickness of approximately 250 μm. The other dimensions are not critical and are assumed to be sufficiently large for the device to be manufactured. An n-type epitaxial layer 17, thickness, for example, 5 μm, doping concentration approximately $6.10^{14}$ atoms/cm$^3$, is grown on the substrate 5 by means of an epitaxy process.

The p-type isolation zone 16, the n-type contact zones 7 and 9 and possible further zones of further circuit elements may be provided in the epitaxial layer 17 in the usual manner and by means of known diffusion and/or ion implantation techniques, after which the surface 2 is provided with the oxide layer 12 which is obtained by thermal oxidation at the surface of the semiconductor body. The thickness of the silicon oxide layer is approximately 800 A.

Figure 2:
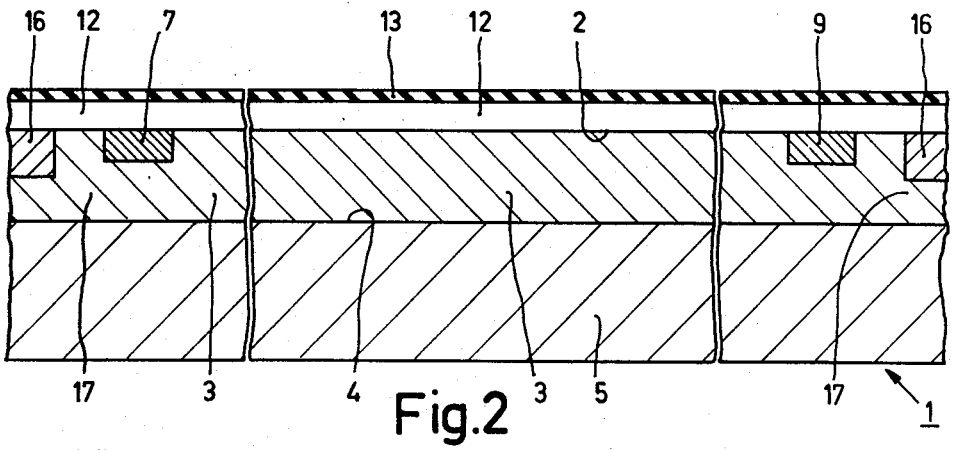
FIGS. 2–6 are sectional views of the device shown in FIG. 1 during a number of stages of the manufacture thereof.
Figure 3:
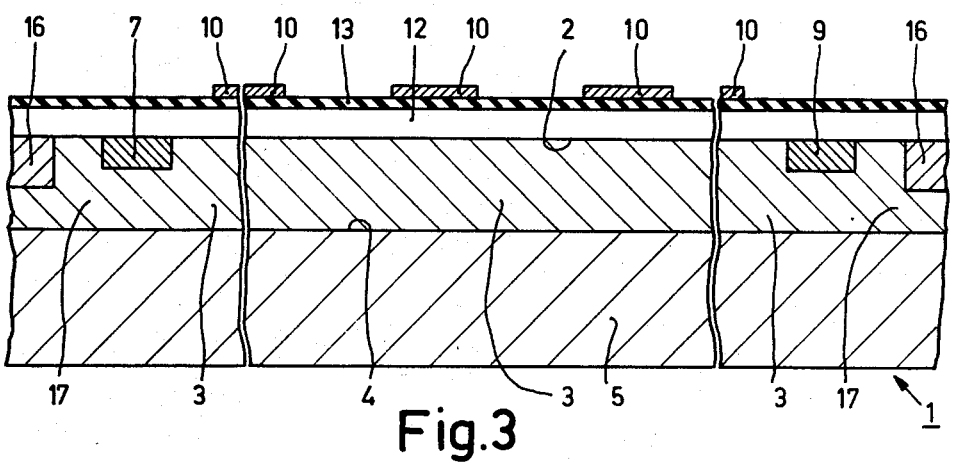
Figure 4:
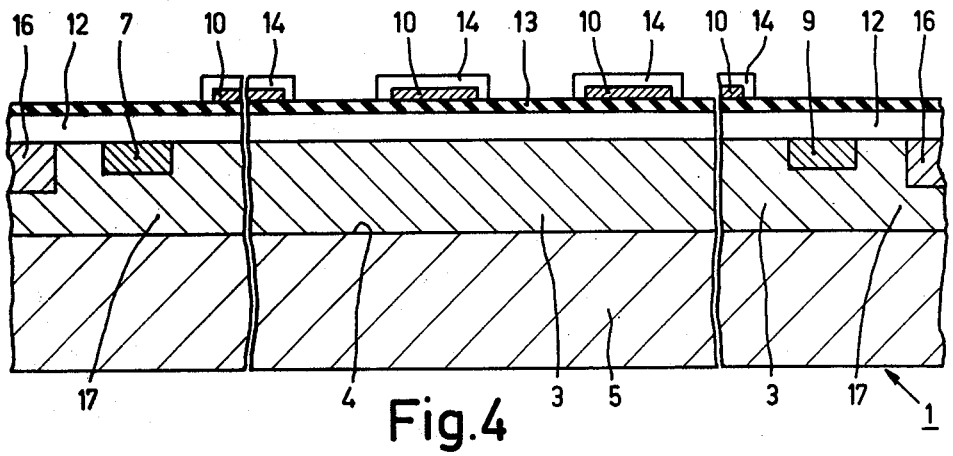

For the protection of the oxide layer 12 against inter alia further oxidation treatments, the silicon nitride layer 13 is deposited in a thickness of approximately 350 A on the oxide layer 12 by means of deposition from the gaseous phase. FIG. 2 shows the device in this stage of the manufacture The electrodes 10 of the lowermost conductor layer are then provided on the nitride layer 13 (see FIG. 3) by depositing a polycrystalline silicon layer which is removed again locally by means of etching so that electrodes 10 and possibly further connections are obtained on the nitride layer 13. The thickness of the electrodes 10 is, for example, approximately 0.6 μm. The material of the electrodes 10 may further comprise a suitable impurity, for example, boron or phosphorus, in a sufficiently high concentration to reduce the resistivity.

By heating at approximately 1000° C in an oxidizing medium, the silicon electrodes 10 may then be oxidized to obtain the silicon oxide layers 14 (see FIG. 4) which will insulate the electrodes 10 from the electrodes 11 of the uppermost conductor layer to be provided afterwards. The thickness of the oxide layers 14 is chosen to be at least so large that at the clock voltages to be applied to the electrodes 10, 11, breakdown between the electrodes is prevented. A specific value for this thickness is approximately 0.3 μm.

It is to be noted that during said oxidation treatment the oxide layer 12 on the surface 2 of the semiconductor body does substantially not vary, in particular as regards the thickness, as a result of the presence of the nitride layer 13 masking against oxidation.

After the oxidation treatment the silicon nitride layer 13 is subjected to a selective etching treatment in an aqueous phosphoric acid solution at approximately 180° C, in which the silicon oxide is not attached or is at least substantially not attacked and in which the nitride layer is removed above the zones 7, 9 and 16 to be contacted and between the electrodes 10. As a result of said etching treatment - which may be carried out without the usual photomasking techniques - apertures 15 are formed in the nitride layer between the electrodes 10, see FIG. 5.

Figure 6:
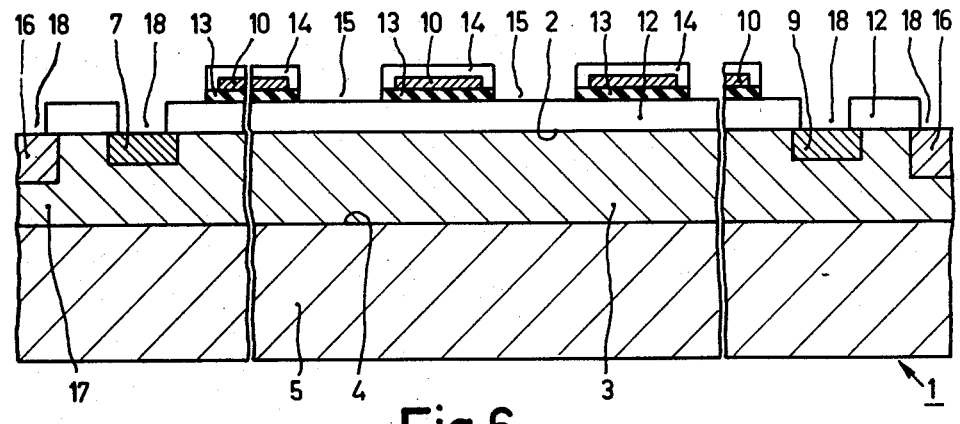

In the resulting structure contact windows may then be provided in the insulating layer 12 in behalf of the contacting of the isolation zones 16 and the provision of the input and output contacts at the area of the contact zones 7 and 9. As a result of the local removal of the nitride layer 13 it is necessary only to provide the contact windows 18 in the oxide layer 12 so that problems associated with the provision of contact windows in a nitride layer can be avoided. As is usual, an etching mask consisting of a layer of photolacquer can simply be provided on the oxide layers 12 and 14, after which the windows can be etched in the oxide layer 12 in a suitable etching bath simultaneously with contact windows (not shown) in the oxide layers 14, after which the layer of photolacquer may be removed again. FIG. 6 shows the device in this stage of its manufacture.

The contacts 6 and 8 of the input and the output, respectively, of the device and the contacts 19 of the isolation zones 16 may be provided simultaneously with the electrodes 11 of the uppermost conductor layer by depositing a layer of aluminum in which the electrodes 11 and the necessary conductor tracks can be obtained in the usual manner by etching.

After etching, the contacts 7, 9 and 19 may be further alloyed by heating the device to, for example, approximately 450° C in a medium to which has been added, for example, $H_2$ so as to reduce surface states at the interface between the surface 2 of the semiconductor body 1 and the oxide layer 12. It is to be noted that such an afterfiring treatment generally proves to be particularly effective, in comparison with structures in which the nitride layer 13 extends through the surface 2 and is not provided with the local apertures 15, which may also be considered as an important advantage of the device.

Figure 7:
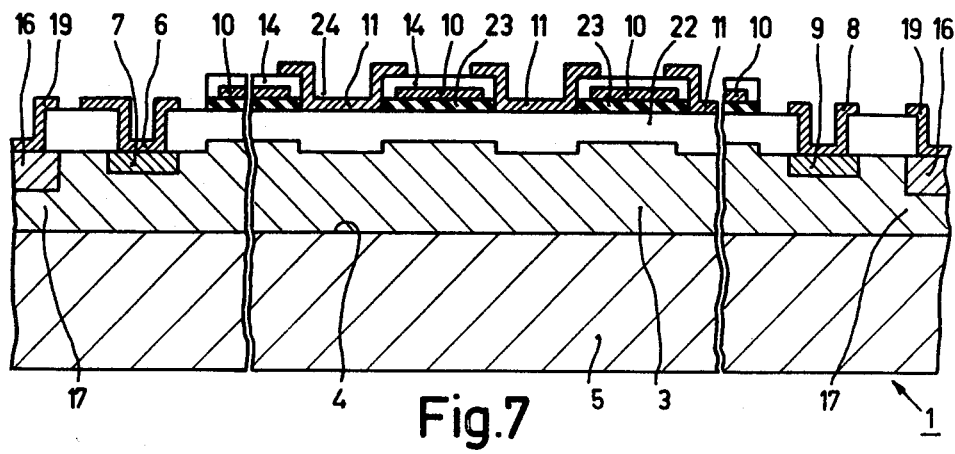
FIG. 7 is a sectional view of a part of a further charge transfer device according to the invention.

The oxide layer 12 in the charge transfer device shown in FIG. 1 shows a uniform thickness. As a result of this the overall thickness of the dielectric below the electrodes 10 of the lowermost conductor layer is slightly larger as a result of the presence of the nitride layer 13 that below the electrodes 11 of the uppermost conductor layer. In many cases this difference is no objection, the more so since the thickness of the nitride layer 13 is small as compared with the underlying oxide layer 12. However, the invention presents the further advantage that this difference in a device according to the invention can be compensated for in a very simple manner as will now be described in detail with reference to the ensuing embodiment. This embodiment relates to a charge-coupled device which is substantially identical to that of the preceding embodiment and, as will be apparent from FIG. 7, is therefore referred to by the same reference numerals as far as corresponding identical components are concerned.

The electrodes 10, 11 are insulated from the semiconductor body 1 by an intermediate insulating layer which again comprises two sub-layers of different materials. The lowermost sub-layer 22 which is formed by a silicon oxide layer obtained by oxidation at the surface of the body again extends throughout the semiconductor layer 3. The second sub-layer 23 of silicon nitride again shows apertures 24 below the electrodes 11 of the uppermost conductor layer. The electrodes 11 are provided on the oxide layer 22 via said apertures.

Unlike the oxide layer 12 in the preceding embodiment, the oxide layer 22 does not have a uniform thickness but at the area of the apertures 24 in the nitride layer 23 below the electrodes 11 of the uppermost conductor layer it shows a larger thickness than below the electrodes 10 of the lowermost conductor layer. The effective thickness of the insulating layer 22 below the electrodes 11 may hence be equal or at least be substantially equal to the effective thickness of the insulating layer 22, 23 below the electrodes 10, so that the charge storage capacity below the electrodes 10, 11 per unit of surface can be substantially the same at least with the same voltage.

Because the dielectric constant of the nitride layer 23 masking against oxidation is generally larger than that of the oxide layer 22, the thickness of the oxide layer 22 below the electrodes 11 is chosen to be smaller than the overall thickness of the oxide layer 22 and the nitride layer 23 below the electrodes 10 of the lowermost conductor layer.

Figure 5:
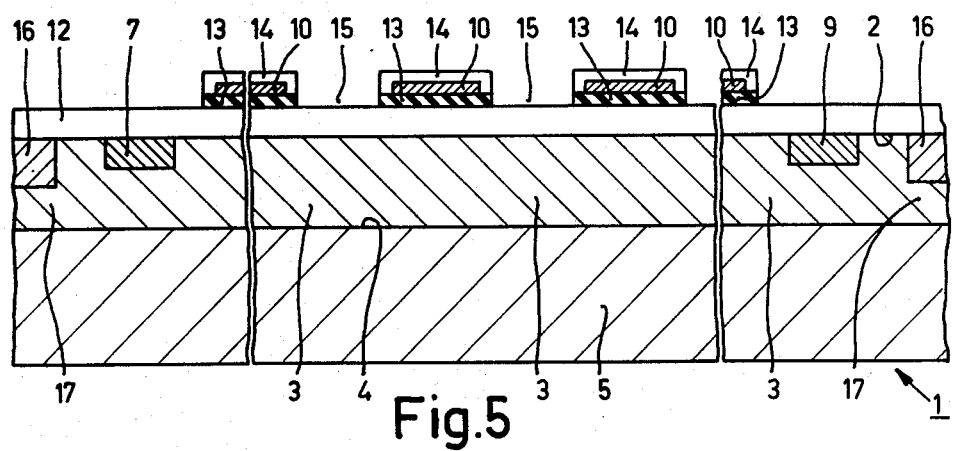

The manufacture of the charge transfer device shown in FIG. 7 is also particularly simple and in particular with respect to the device described in the preceding embodiment it requires no extra critical and/or laborious photomasking steps. Starting material for the manufacture may be a structure as is shown in FIG. 5 of the preceding embodiment in which instead of the layers 12 and 13 the layers 22 and 23 are provided on the body in a thickness of approximately 800 A and 350 A, respectively.

Figure 8:
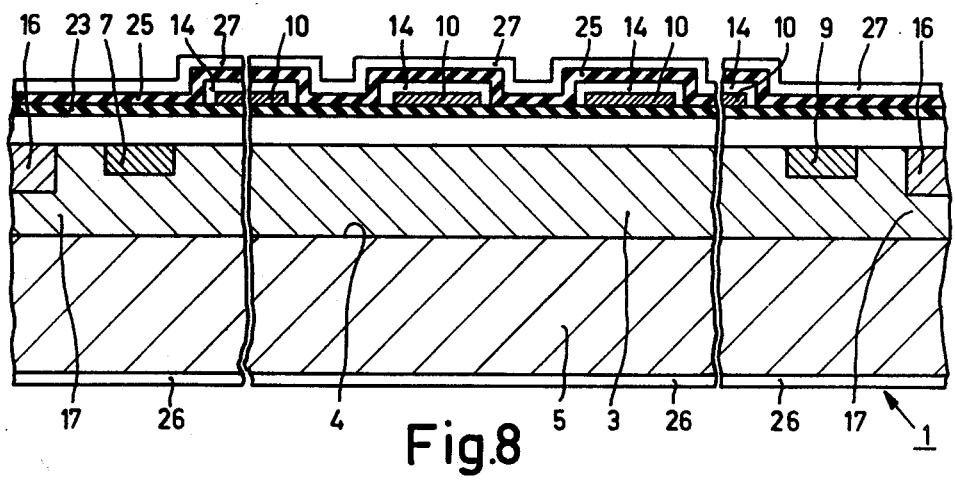
FIGS. 8 and 9 are sectional views of the device shown in FIG. 7 during various stages of manufacture.

After providing the oxide layers 14 by oxidation of the polycrystalline silicon electrodes 10 - in which the semiconductor body is masked against oxidation by the silicon nitride layer 23 - an additional protective layer 25 is provided throughout the surface of the device. Said layer in the present embodiment also consists of silicon nitride, see FIG. 8. A phosphorus-doped oxide layer 26 which forms a gettering layer is then provided on the lower side of the body 1. At the same time a similar phosphorus-doped oxide layer 27 is deposited on the upper side and is separated from the oxide layer 14 by the intermediate additional silicon nitride layer 25.

It is to be noted that it is generally known and usual in semiconductor technology during the manufacture of a semiconductor device to screen the upper side of the device where usually the active elements are present before providing the gettering layer 26 by depositing on said side a silicon oxide layer from the gaseous phase. The phosphor oxide layer 26 may then be provided on the lower side, diffusion of phosphorus on the upper side of the device being prevented by means of the provided silicon oxide screening layer. In a subsequent process step the screening layer should usually be removed again entirely or at least partly. In particular because the screening layer generally shows some spreading in thickness, the passivating layer present on the surface of the body and usually also consisting of silicon oxide may also be attacked during the etching away. The possibility even exists that the passivating layer is etched locally throughout its thickness so that apertures are formed in the passivating layer via which shortcircuit may occur. However, this drawback can be avoided like in the present embodiment by providing a screening layer 25 which can be etched selectively relative to silicon oxide on the upper side of the device before providing the gettering layer 26. In the present embodiment the screening layer 25 which protects the polycrystalline silicon electrodes 10 from the phosphor oxide layer 27 consists of silicon nitride which can be etched selectively relative to the silicon oxide layer 14 above the polycrystalline silicon electrodes 10. However, instead of silicon nitride, of course other materials, for example, aluminum oxide or double layers of, for example, silicon nitride and silicon oxide which are deposited on the nitride, may also be used. In addition said method may also be used advantageously during the manufacture of charge transfer devices other than those described here.

The oxide layer 27 on the upper side is then removed again, for example, by means of etching, in which the oxide layer 26 on the lower side of the body can be masked by a layer of photolacquer provided on the whole lower side. After removing the oxide layer 27 the additional silicon nitride layer 25 is removed by etching in phosphoric acid at a temperature of approximately 180° C. In this etching treatment the silicon oxide present is not or at least hardly attacked. At the same time the silicon nitride layer 23 in so far as it is not masked by the electrodes 10 and the associated oxide layers 14 is removed so that the oxide layer 22 above the input and output zones 7 and 9 and above the isolation zone 16 is exposed and apertures 24 are formed in the nitride layer 23 between the electrodes 10.

Figure 9:
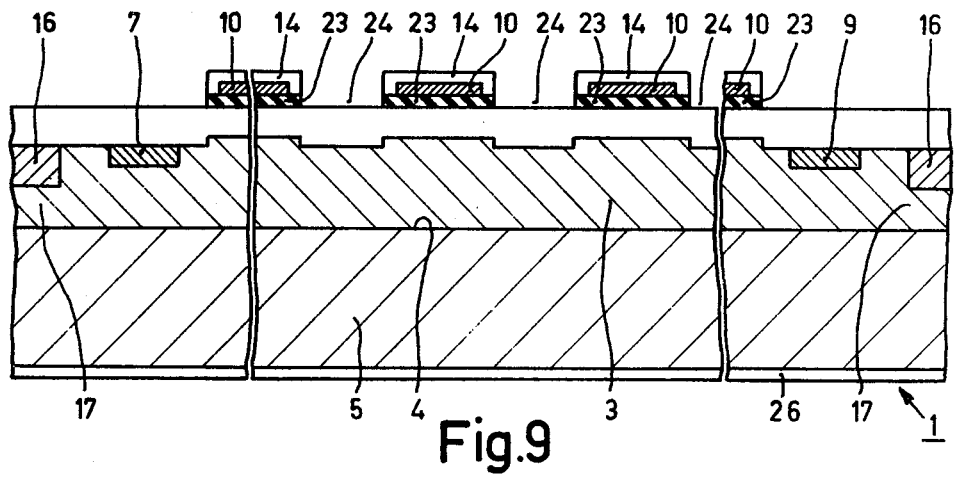

A so-called "getter-drive-in" step or getter afterfiring step is then carried out in which heavy metal atoms presumably present in the body 1 diffuse in an accelerated manner in the direction of the oxide layer 26. This "getter-drive-in" step is carried out at a temperature of approximately 1000° C in a medium which is oxidizing at least for a comparatively short time. Below the apertures 24 in the nitride layer and above the zones 7, 9 and 16 where the semiconductor body 1 is no longer masked against oxidation by the nitride layer 23, the oxide layer 22 locally increases in thickness during the gettering treatment as a result of oxidation at the surface 2. The oxidation is continued until the oxide layer 22 below the apertures 24 (see FIG. 9) is approximately 200 A thicker than below the electrodes 10. The overall thickness of the insulating layer 22 at the area of the apertures 24 then is approximately 1000 A silicon oxide, while the insulating layer below the electrodes 10 consists of approximately 800 A silicon oxide and of 350 A silicon nitride.

In most of the cases the oxide layer to be formed below the apertures in the second sub-layer is very thin - in practical embodiments not more than a few hundreds of Angstrom units -, in particular with respect to the oxide layer which is provided on the electrodes of the lowermost conductor layer. The extra oxidation step which is necessary to grow said thin oxide layer may therefore be of a short duration or may take place at a comparatively low temperature and, if desired, be combined with one or more further temperature treatments, for example, gettering.

The dielectric constants of the two sub-layers will generally be different. In most of the cases the dielectric constant of the nitride layer will be larger than that of the oxide layer. Said difference has been compensated for at least partly in that the thickness of the oxide layer at the area of the apertures in the nitride layer below the electrodes of the uppermost conductor layer is substantially equal to and preferably smaller than the overall thickness of the oxide layer below the electrodes of the lowermost conductor layer.

After the combined gettering treatment and oxidation treatment, contact windows may be provided in the oxide layer 22 at the area of the zones 16, 7 and 9 and in the oxide layers 14, which requires no extra laborious steps since the nitride layer 23 is locally removed entirely. Just as in the preceding embodiment, the electrodes 11 of aluminum and the contacts 6, 8 and 16 may then be provided in the usual manner.

It will be obvious that the invention is not restricted to the embodiments described but that many variations are possible to those skilled in the art without departing from the scope of this invention.

For example, instead of a homogeneously doped semiconductor layer 3, a semiconductor layer may advantageously be used which has a relatively highly doped thin surface layer and an underlying and adjoining relatively low doped thick region. Such a highly doped thin surface layer is shown in FIG. 1 by the broken lines 28.

The oxidation treatment which is carried out simultaneously with the gettering treatment so as to locally increase the thickness of the oxide layer 22 in the device according to the second embodiment may also be carried out during other temperature treatments or in a separate process step.

Materials other than those mentioned here may also be used advantageously. For example, the electrodes 10 of the lowermost conductor layer may consist of a suitable metal, for example, aluminum or tantalum, instead of polycrystalline silicon.

Instead of in charge-coupled devices with bulk transport, the invention may also be used in other types of charge transfer devices, for example, in charge-coupled devices having charge transport along the surface of the semiconductor body or in bucket brigade devices.

Furthermore, in the embodiments described the aluminum electrodes 11 may each be connected conductively to an adjacent silicon electrode 10, either externally, or via contact windows in the oxide layers 15.

What is claimed is:

1. A method of manufacturing a charge transfer device comprising a semiconductor body having an electrode system provided on a surface for capacitively generating electric fields in the body by means of which electric charge can be transported through the body, said electrode system comprising a series of electrodes insulated from the surface of the body by an insulating layer and including lowermost conductors and uppermost conductors with each electrode of the uppermost conductors extending above an adjacent lowermost conductor and being separated therefrom by an intermediate insulating layer, comprising the steps of: forming on the surface of the semiconductor body said insulating layer having a double layer comprising a first sub-layer adjoining the surface of the body and a second sub-layer on the first sub-layer and constituted of a material differing from the first sub-layer and capable of masking the semiconductor body against oxidation and capable of being selectively removed relative to the first sub-layer, forming on the double layer the lowermost conductors, subjecting the lowermost conductors to an oxidation treatment to obtain the said intermediate insulating layer, the second sub-layer masking the underlying material of the semiconductor body against oxidation during said oxidation treatment, thereafter subjecting the second sub-layer to a selective removal treatment as a result of which the second sub-layer is removed locally while the first sub-layer is left substantially in place, the electrodes of the lowermost conductors with the oxide layer formed thereon serving as a selective-removal mask, and thereafter forming thereon the uppermost conductors which become separated from the surface of the semiconductor body at least mainly only by the first sub-layer of the insulating layer.

2. A method as claimed in claim 1, wherein the selective removal treatment is an etching treatment, and as a result of the etching treatment for the local removal of the second sub-layer apertures are formed in the second sub-layer between the lowermost conductors, the uppermost conductors extending on the first sub-layer of the insulating layer and in said apertures.

3. A method as claimed in claim 2, wherein after the said etching treatment and prior to providing the uppermost conductors, the semiconductor body is subjected locally to an oxidation treatment to increase the thickness of the insulating layer at the area of said apertures in the second sub-layer.

4. A method as claimed in claim 3, wherein the oxidation treatment for the local oxidation of the semiconductor body is at most continued until the thickness of the insulating layer at the area of the apertures in said second sub-layer is equal to or less than the overall thickness of the insulating layer below the lowermost conductors.

5. A method as claimed in claim 3, wherein, after the oxidation treatment of the lowermost conductors to obtain the said intermediate insulating layer, the semiconductor body is subjected to a gettering treatment while the semiconductor body is covered, at least at its major surfaces, with an impurity-doped gettering oxide layer which is separated from the said surface by a screening layer which is of the same material as the said second sub-layer and which is provided prior to said etching treatment above the lowermost conductors and the second sub-layer and which is later removed entirely during the etching treatment in which the second sub-layer of the insulating layer is locally removed.

6. A method as claimed in claim 1, wherein the lowermost conductors are provided in the form of layers of polycrystalline silicon doped with an impurity.

7. A method as claimed in claim 1, wherein the first sub-layer is formed by a layer of silicon oxide and the second sub-layer masking the semiconductor body against oxidation is formed by a layer of silicon nitride.

* * * * *